United States Patent [19]

Hayakawa et al.

[11] Patent Number: 5,254,171
[45] Date of Patent: Oct. 19, 1993

[54] BIAS ECR PLASMA CVD APPARATUS COMPRISING SUSCEPTOR, CLAMP, AND CHAMBER WALL HEATING AND COOLING MEANS

[75] Inventors: Hideaki Hayakawa, Kanagawa; Junichi Sato, Tokyo; Tetsuo Gocho, Kanagawa, all of Japan

[73] Assignee: Sony Corporation, Tokyo, Japan

[21] Appl. No.: 867,516

[22] Filed: Apr. 13, 1992

[30] Foreign Application Priority Data

Apr. 16, 1991 [JP] Japan .............................. 3-025592[U]

[51] Int. Cl.$^5$ .................. C23C 16/00; C23C 16/50
[52] U.S. Cl. .......................... 118/723 MR; 118/724; 118/725; 118/728
[58] Field of Search ............... 118/723, 724, 725, 728; 156/345

[56] References Cited

U.S. PATENT DOCUMENTS

| | | | |
|---|---|---|---|
| 4,902,934 | 2/1990 | Miyamura et al. | 118/728 |
| 5,078,851 | 1/1992 | Nishihata et al. | 156/345 |
| 5,085,750 | 2/1992 | Soraoka et al. | 156/643 |
| 5,091,208 | 2/1992 | Pryor | 118/723 |

FOREIGN PATENT DOCUMENTS

| | | |
|---|---|---|
| 61-247696 | 11/1986 | Japan . |
| 63-185891 | 8/1988 | Japan . |
| 63-265890 | 11/1988 | Japan . |
| 1-36085 | 5/1989 | Japan . |
| 1-235259 | 9/1989 | Japan . |
| 2-228035 | 9/1990 | Japan . |

*Primary Examiner*—Brian E. Hearn
*Assistant Examiner*—Jonathan D. Baskin
*Attorney, Agent, or Firm*—Hill, Steadman & Simpson

[57] ABSTRACT

A bias ECR plasma CVD apparatus includes an ECR plasma generating chamber and a plasma CVD chamber for forming a film on a substrate by a plasma CVD reaction. A heating device and a cooling device are provided at least in the vicinity of the substrate for maintaining the substrate and the vicinity thereof at a constant temperature. With this construction, the number of contaminant particles deposited on a surface of the substrate in forming the film on the substrate can be reduced.

5 Claims, 4 Drawing Sheets

BIAS ECR PLASMA CVD APPARATUS COMPRISING SUSCEPTOR, CLAMP, AND CHAMBER WALL HEATING AND COOLING MEANS

BACKGROUND OF THE INVENTION

The present invention relates to a bias ECR (Electron Cyclotron Resonance) plasma CVD (Chemical Vapor Deposition) apparatus, and more particularly to a bias ECR plasma CVD apparatus which can reduce the number of particles being generated in a CVD reaction chamber and deposited to a film formed on a substrate (wafer).

In the recent development of ULSI (Ultra Large Scale Integration), an increase in the degree of integration and an increase in operating speed accompany increasingly severe demands to fine working techniques and cleaning techniques.

In particular, impurities and particles of foreign matter deposited on a film formed on a substrate (wafer) cause problems such as breakdown or short circuits, causing a reduction in yield and reliability. Accordingly, a reduction in the number of foreign matter particles is increasingly required in the manufacturing process for integrated circuits.

The above problem caused by the particles occurs without exception in a film forming method using a bias ECR (Electron Cyclotron Resonance) plasma CVD apparatus (which will be referred simply to as an ECR-CVD apparatus) which can flat form an insulating film or the like at low temperatures of about 200°-350° C.

However, a mechanism for reducing the number of particles is not generally provided in a conventional ECR-CVD apparatus.

As shown in FIG. 4, the conventional ECR-CVD apparatus is comprised of an ECR plasma generating chamber 20 and a plasma CVD chamber 21. The ECR plasma generating chamber 20 is comprised of a wave guide pipe 2 for introducing a micro ($\mu$) wave (2.45 GHz) 1 into a plasma generating chamber 4 and a coil 3 surrounding the wave guide pipe 2 for applying an electromagnetic field to the microwave 1. $N_2O$ and Ar gas 10 is supplied to the plasma generating chamber 4 and an electromagnetic field is applied to the microwave 1, thereby generating a plasma. The plasma CVD chamber 21 is comprised of a plasma reaction chamber (which will be hereinafter referred simply to as a chamber) 6 into which the plasma is fed through a plasma drawing window 5 formed of quartz to effect a plasma CVD reaction. A stock gas (e.g., $SiH_4$) for film formation is supplied through a stock gas ring 7 into the chamber 6. In the chamber 6, the reactant gas is activated by a collision effect of ions and electrons to form a desired film on a surface of a wafer 8 as a substrate. A quartz coating 13 is formed on an inner wall of the plasma generating chamber 4 to prevent the generation of contaminants and particles such as Cr, Fe and Ni from SUS. A quartz window is provided at a micro wave introducing portion. The wafer 8 is supported on a sample bed (susceptor) 9 serving as a support bed. The ECR-CVD method applies electron cyclotron resonance, so that the power absorbing efficiency is high, and the confinement effect by a magnetic field is exhibited, thereby effecting high-density plasma generation.

In the film forming method using the conventional ECR-CVD apparatus as described above, the stock gas supplied is wholly expanded in the chamber 6, so that a reaction product is deposited on not only the surface of the wafer 8 but also an inner surface of a chamber wall 11 and exposed surfaces of the plasma drawing window 5 and the susceptor 9 (which will be hereinafter referred to as an inner surface of the chamber 6) as shown by a dashed line in FIG. 4, thus forming a film 12. It is considered that the film 12 is occasionally separated to cause the generation of the contaminant particles.

It is considered that the separation of the film 12 formed on the inner surface of the chamber 6 is caused by a difference in thermal shrinkage factors between the deposited film and the metal (e.g., SUS 308) of the inner surface of the chamber 6 due to an increase in temperature in the chamber 6 by the collision of ions and electrons existing in the plasma during the film formation and a decrease in temperature after the film formation.

SUMMARY OF THE INVENTION

It is accordingly an object of the present invention to provide a bias ECR plasma CVD apparatus which can reduce the number of particles depositing to the surface of the substrate in forming a desired film on the substrate.

According to the present invention, there is provided in a bias ECR (Electron Cyclotron Resonance) plasma CVD (Chemical Vapor Deposition) apparatus including an ECR plasma generating chamber and a plasma CVD chamber for forming a film on a substrate by a plasma CVD reaction; the improvement comprising a heating device and a cooling device provided at least in the vicinity of the substrate for maintaining the substrate and the vicinity thereof at a constant temperature.

With this construction, at least the vicinity of the substrate is maintained at a constant temperature in forming a film on the substrate. Accordingly, a difference in thermal shrinkage factors between a film deposited on an inner surface of the plasma CVD chamber and the inner surface thereof can be made small, thereby preventing the separation of the deposited film to, thus, reduce the number of particles being deposited on the surface of the substrate.

Other objects and features of the invention will be more fully understood from the following detailed description and appended claims when considered with the accompanying drawings.

DETAILED DESCRIPTION OF THE PREFERRED EMBODIMENTS

Figure 1:
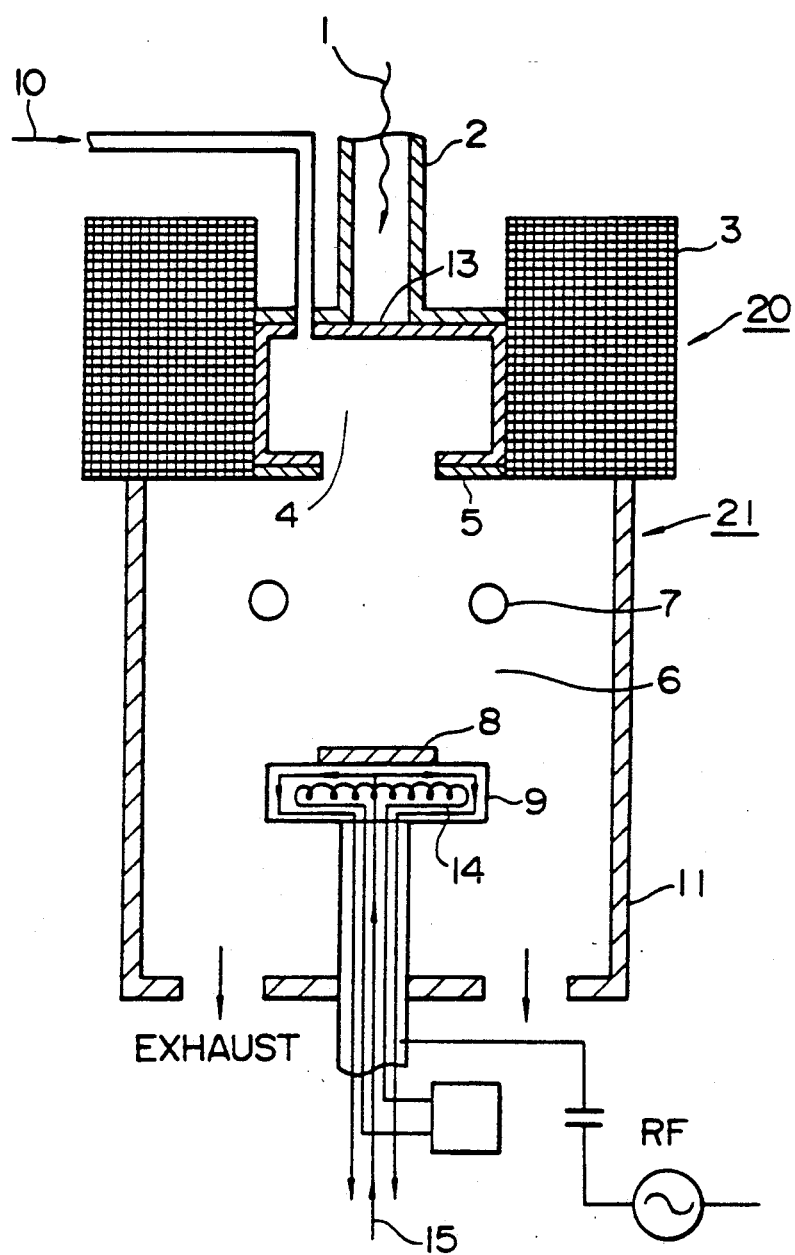
FIG. 1 is a schematic sectional view of a first preferred embodiment of the bias ECR plasma CVD apparatus according to the present invention.

There will now be described some preferred embodiments of the present invention with reference to the drawings, wherein the same parts are designated by the same reference numerals.

Figure 4:
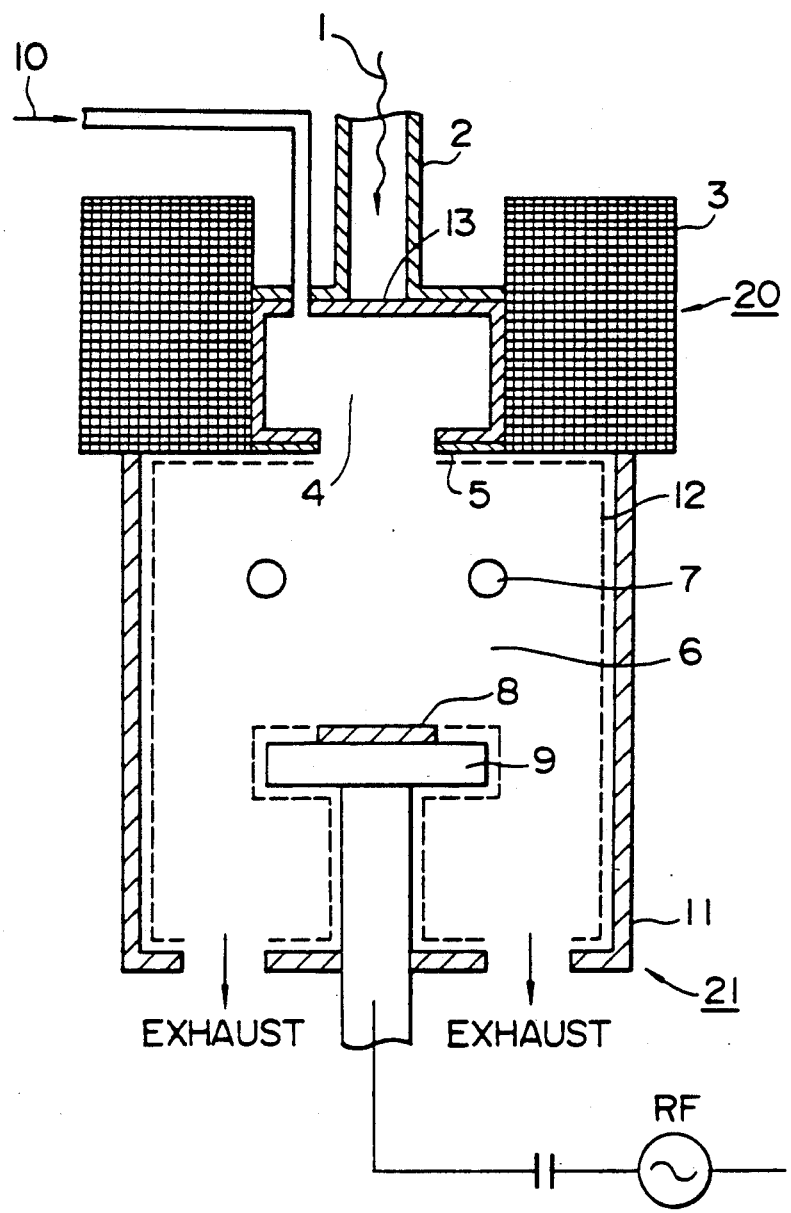
FIG. 4 is a schematic sectional view of the conventional bias ECR plasma CVD apparatus.

Referring to FIG. 1 which shows a first preferred embodiment of the present invention, the bias ECR plasma CVD apparatus is generally comprised of an ECR plasma generating chamber 20 and a plasma CVD chamber 21. The construction of the first preferred embodiment shown in FIG. 1 is substantially the same as that of the prior art shown in FIG. 4 with the exception that a heater 14 and a cooling water supply pipe 15 are provided in the sample bed (susceptor) 9 for supporting the wafer or substrate 8. Accordingly, the explanation of the other parts will be omitted hereinafter. The heater 14 is a resistance heating member.

N$_2$O and Ar gas 10 is supplied into the plasma generating chamber 4, so as to make a silicon dioxide (SiO$_2$) film grow on the surface of the wafer 8, while SiH$_4$ as a stock gas is supplied through the stock gas ring 7 into the plasma reaction chamber 6.

In this preferred embodiment, before forming the SiO$_2$ film on the wafer 8, the heater 14 is preliminarily operated to heat the whole of the interior of the chamber 6 to a predetermined temperature and maintain this temperature.

During the film formation, a cooling water is supplied through the cooling water supply pipe 15 to the susceptor 9 under the condition where an amount of heat generation due to the collision of ions and electrons existing in the plasma can be sufficiently exchanged. While the cooling water is being supplied, the heater 14 continues to be operated to maintain a constant temperature condition.

The number of contaminant particles deposited to the surface of the wafer 8 was measured in the case of heating the susceptor 9 at 310° C. and 440° C. and in the case of not heating the susceptor 9 at all. The result of measurement is shown in Table 1.

TABLE 1

(The number of contaminant particles deposited per wafer)

| | Present Invention | | |
|---|---|---|---|
| | Heating at 310° C. | Heating at 440° C. | Prior Art |
| 1 | 221 | 135 | 175 |
| 2 | 285 | — | 121 |
| 3 | 116 | — | 183 |
| 4 | 77 | — | 230 |
| 5 | 71 | 181 | 270 |
| 6 | 77 | — | 413 |
| 7 | 185 | — | 481 |
| 8 | 73 | 62 | 550 |
| Ave. | 138 | 126 | 303 |

The film forming conditions in the present invention and the prior art are as follows:
(1) Stock gas flow: SiH$_4$/N$_2$O = 20/35 (SCCM)
(2) RF power: 400 (W)
(3) Micro ($\mu$) wave (2.45 GHz) power: 1000 (W)
(4) Pressure in the chamber: $8.0 \times 10^{-4}$ (Torr)
(5) Film forming time: 9 (min)

In the prior art (in which the susceptor 9 was not heated), the temperature of the susceptor 9 during the film formation was 75°–105° C. The numbers of contaminant particles shown in Table 1 in both the present invention and the prior art were data after maintenance. In the case of heating the susceptor 9 at 440° C. in the present invention, the film formation was applied to eight wafers, and three of the eight wafers were sampled to measure the number of contaminant of particles deposited on the surface of each wafer.

It is apparent from Table 1 that the number of contaminant particles deposited on the surface of the wafer 8 in the present invention wherein the susceptor 9 was heated at 310° C. and 440° C. is smaller than that in the prior art wherein the susceptor 9 was not heated.

Figure 2:
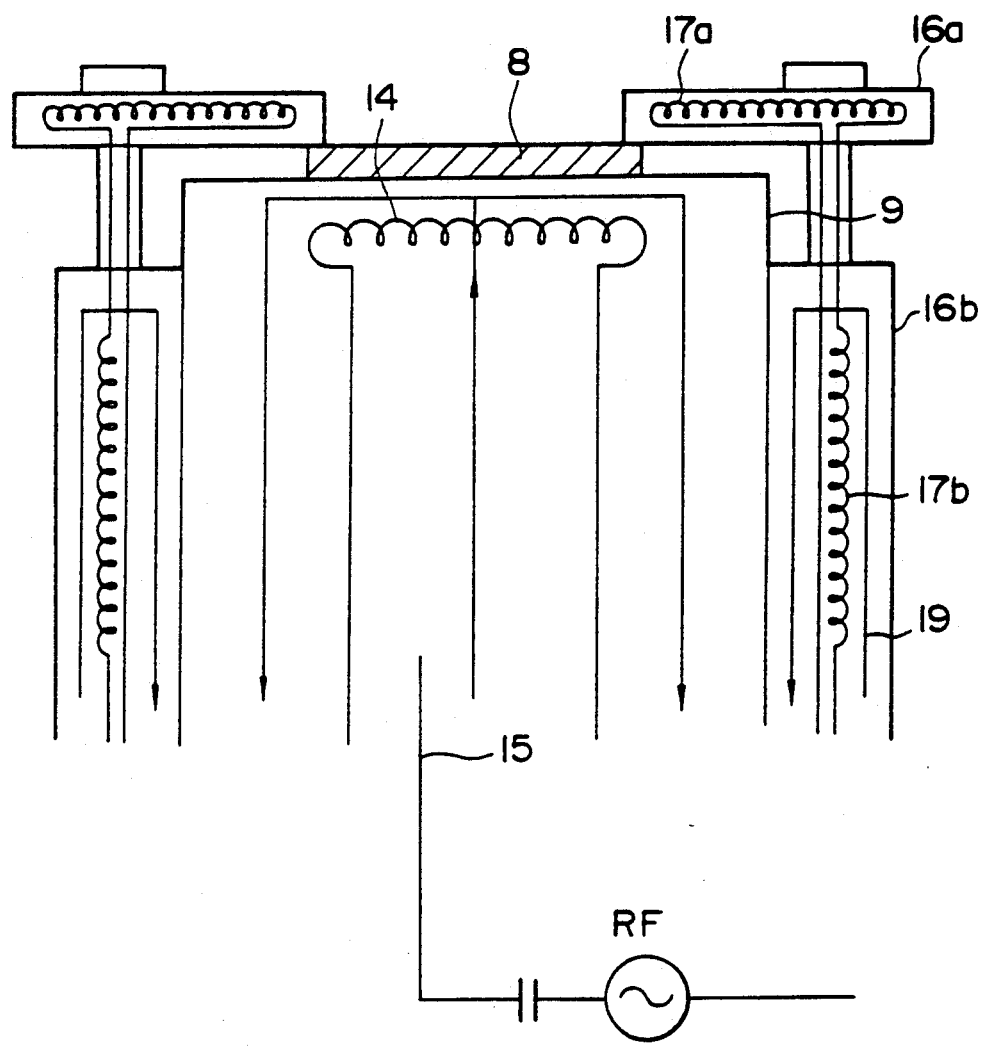
FIG. 2 is a schematic sectional view of a heater and a cooling water supplying mechanism including the provision of a mechanical clamp for clamping a wafer.

Referring to FIG. 2 which shows a modification of the first preferred embodiment, a mechanical clamp mechanism for clamping the wafer 8 is provided, and the mechanical clamp mechanism is equipped with a heater and a cooling water supply pipe.

In this modification, like the first preferred embodiment shown in FIG. 1, the heater 14 and the cooling water supply pipe 15 are provided in the susceptor 9 in the vicinity of the wafer 8. In addition, a heater 17a is provided in a mechanical clamp 16a for clamping the wafer 8, and a heater 17b and a cooling water supply pipe 19 are provided in a mechanical clamp holder 16b for holding the mechanical clamp 16a. The mechanical clamp 16a and the mechanical clamp holder 16b are formed of quartz glass or the like.

Figure 3:
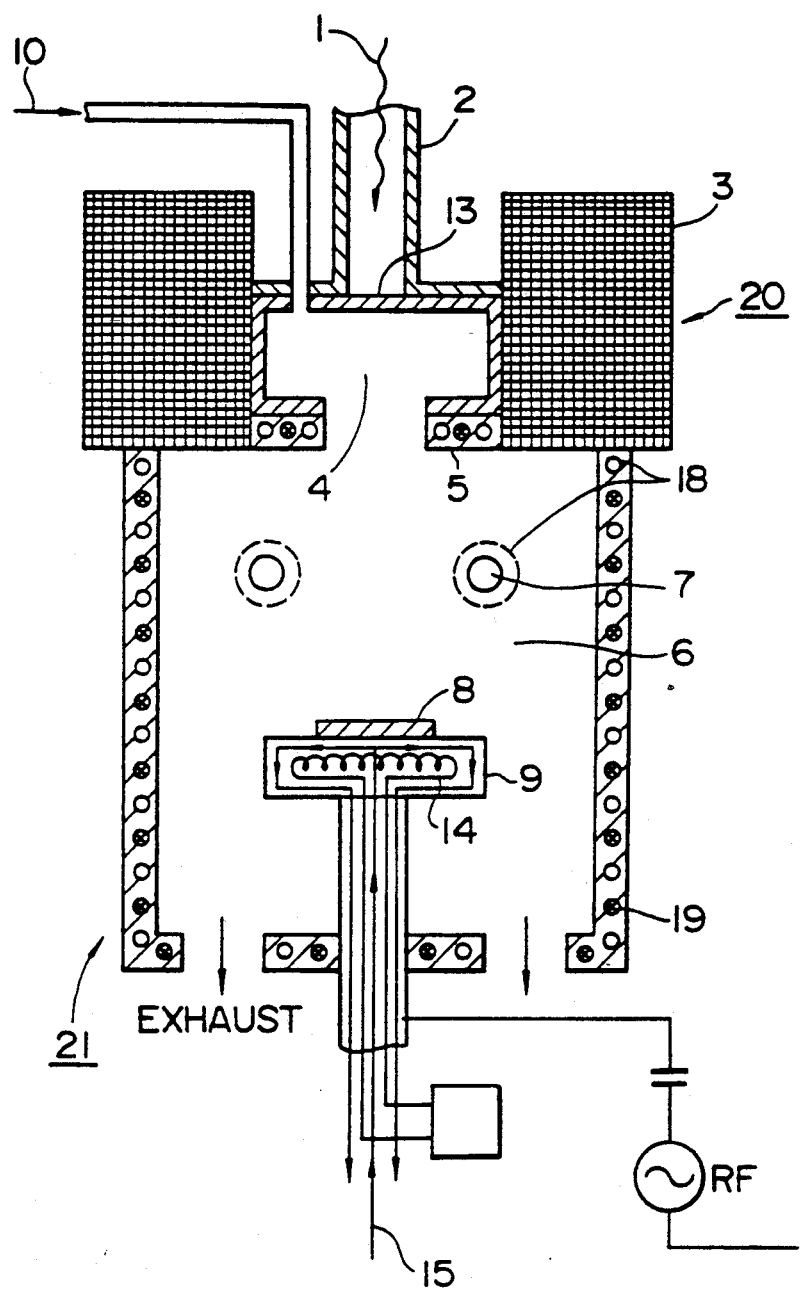
FIG. 3 is a schematic sectional view of a second preferred embodiment of the bias ECR plasma CVD apparatus according to the present invention.

Referring to FIG. 3 which shows a second preferred embodiment of the present invention, a heater 18 and a cooling water supply pipe 19 are added to the construction of the first preferred embodiment shown in FIG. 1. As shown in FIG. 3, the heater 18 and the cooling water supply pipe 19 are alternately provided in the wall of the chamber 6 and the plasma drawing window 5, so as to enhance a constant temperature maintaining effect.

Also in this preferred embodiment, it was confirmed that the number of particles was reduced similarly to the first preferred embodiment.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A bias ECR plasma CVD apparatus including an ECR plasma generating chamber and a plasma CVD chamber for forming a film on a substrate by a plasma CVD reaction, comprising:
   a susceptor for supporting the substrate;
   a first heating device and a first cooling device provided in said susceptor for maintaining the substrate and a vicinity about the substrate at a constant temperature;
   a mechanical clamp means for clamping the substrate, said mechanical clamp means comprising a mechanical clamp for clamping the substrate and a mechanical clamp holder for holding said mechanical clamp; and
   a second heating device and a second cooling device provided in said mechanical clamp means for maintaining the substrate and the vicinity about the substrate at a constant temperature.

2. A bias ECR plasma CVD apparatus as defined in claim 1, wherein the plasma CVD chamber has a wall, and further comprising:
   a plurality of third heating devices and a plurality of third cooling devices provided in said wall of said plasma CVD chamber.

3. A bias ECR plasma CVD apparatus as claimed in claim 2, wherein said plurality of third heating devices and said plurality of third cooling devices are arranged in alternation in said wall of said plasma CVD chamber.

4. A bias ECR plasma CVD apparatus as claimed in claim 2, wherein said plurality of fourth heating devices and said plurality of fourth cooling devices are arranged in alternation in said wall of said plasma drawing window.

5. A bias ECR plasma CVD apparatus as claimed in claim 1, further comprising:
   a plasma drawing window having a wall; and
   a plurality of fourth heating devices and a plurality of fourth cooling devices provided in said wall of said plasma drawing window.

* * * * *